US009496244B2

(12) United States Patent
Enomoto et al.

(10) Patent No.: US 9,496,244 B2
(45) Date of Patent: Nov. 15, 2016

(54) LIGHT EMITTING MODULE AND LIGHT IRRADIATING APPARATUS

(71) Applicant: USHIO DENKI KABUSHIKI KAISHA, Tokyo (JP)

(72) Inventors: Koji Enomoto, Hyogo (JP); Takumi Sato, Hyogo (JP); Yoshihiro Kanahashi, Hyogo (JP); Yoshihisa Yokokawa, Hyogo (JP)

(73) Assignee: Ushio Denki Kabushiki Kaisha, Tokyo (JP)

( * ) Notice: Subject to any disclaimer, the term of this patent is extended or adjusted under 35 U.S.C. 154(b) by 69 days.

(21) Appl. No.: 14/644,889

(22) Filed: Mar. 11, 2015

(65) Prior Publication Data

US 2015/0260368 A1    Sep. 17, 2015

(30) Foreign Application Priority Data

Mar. 11, 2014    (JP) .................................. 2014-047657

(51) Int. Cl.
| | |
|---|---|
| *H01L 25/075* | (2006.01) |
| *F21V 5/00* | (2015.01) |
| *G02B 3/00* | (2006.01) |
| *H01L 33/54* | (2010.01) |

(52) U.S. Cl.
CPC ........... *H01L 25/0753* (2013.01); *F21V 5/007* (2013.01); *G02B 3/00* (2013.01); *H01L 33/54* (2013.01); *H01L 2224/4848* (2013.01); *H01L 2224/48091* (2013.01); *H01L 2224/48465* (2013.01); *H01L 2924/0002* (2013.01); *H01L 2924/181* (2013.01)

(58) Field of Classification Search
CPC .............. F21V 5/04; F21V 5/007; F21V 5/08; F21V 5/048; F21V 23/005; F21Y 2101/02; G02B 13/003; G02B 3/00; H01L 25/0753; H01L 33/54; H01L 2224/4848; H01L 2224/48091; H01L 2924/0002; H01L 2224/48465; H01L 2924/181; H01L 2924/00014; H01L 2924/00012; H01L 2924/00
See application file for complete search history.

(56) References Cited

U.S. PATENT DOCUMENTS 7,819,550 B2 * 10/2010 Anderson ............... F21V 5/007
                                                         362/235
7,963,674 B2    6/2011 Takekuma et al.
(Continued)

FOREIGN PATENT DOCUMENTS

| JP | 2008-108861 A | 5/2008 |
| JP | 5359732 B2 | 12/2013 |

*Primary Examiner* — Bao Q Truong
(74) *Attorney, Agent, or Firm* — Michael Best & Friedrich LLP

(57) ABSTRACT

A light emitting module includes: a substrate; at least one light emitting element line including a plurality of light emitting elements that are arrayed on the substrate in a first direction; and at least one sealing lens sealing the at least one light emitting element line, and including a plurality of lens sections. The lens sections each include a spherical light emission surface having a convex shape, and are provided corresponding to the respective light emitting elements and continuous in the first direction. The lens sections each satisfy predetermined expressions (1) and (2).

16 Claims, 6 Drawing Sheets

(56) References Cited

U.S. PATENT DOCUMENTS

| | | | | |
|---|---|---|---|---|
| 8,664,675 B2* | 3/2014 | Huang | ............... | H01L 25/0753 |
| | | | | 257/100 |
| 2007/0030676 A1* | 2/2007 | Ichihara | ................... | F21K 9/00 |
| | | | | 362/244 |
| 2013/0083541 A1* | 4/2013 | Fang | ...................... | F21V 5/007 |
| | | | | 362/311.02 |

\* cited by examiner

RELATED ART

LIGHT EMITTING MODULE AND LIGHT IRRADIATING APPARATUS

CROSS REFERENCE TO RELATED APPLICATIONS

This application claims the benefit of Japanese Priority Patent Application JP2014-047657 filed on Mar. 11, 2014, the entire contents of which are incorporated herein by reference.

BACKGROUND

The invention relates to a light emitting module that may be, without limitation, used as a light source of a light irradiating apparatus configured to irradiate an irradiated object with light while a positional relationship between a light source section and the irradiated object is relatively varied in one direction.

In recent years, a development of a light source unit is in progress in which a plurality of light emitting elements are arrayed on the same plane. The light source unit may be linear or planar in shape, and the light emitting elements each may be a light emitting diode (LED) element, for example. The light source unit is used for an apparatus such as, but not limited to, a light treatment apparatus, an inspection apparatus, and a medical apparatus.

For such a light source unit, further increase in a packaging density of light emitting elements per unit area, improvement in extraction efficiency of light derived from each light emitting element, etc. have been desired in order to achieve light having higher power.

In general, a structure has been employed, as a technique to improve the extraction efficiency of light derived from the light emitting elements, in which the light emitting elements disposed on one surface of a substrate are, for example, sealed by a transmissive resin layer having a lens function. For example, reference is made to Japanese Unexamined Patent Application Publication No. 2008-108861 and Japanese Patent No. 5359732.

Referring to FIG. 10, for example, Japanese Unexamined Patent Application Publication No. 2008-108861 discloses a light emitting module 40a having a structure in which a light emitting element 45 as an LED chip, mounted on one surface 42 of a substrate 41 having a power supply wiring line, is sealed by a sealant 48 made of a transmissive resin having a lens function.

Referring to FIG. 11, Japanese Patent No. 5359732 discloses a light emitting module 40b in which a plurality of light emitting elements 45 are mounted on one surface 42 of a substrate 41. The disclosed light emitting module 40b has a structure in which the light emitting elements 45 are arrayed one dimensionally and lens sections 51 corresponding to the respective light emitting elements 45 are formed integrally with each other, and in which a lens array 50 made of a transmissive resin is so provided as to cover each of the light emitting elements 45.

SUMMARY

In a light emitting module in which a plurality of light emitting elements are mounted on a substrate, further increase in a packaging density of the light emitting elements has been desired in order to achieve light having higher power as described above.

Also, some light treatment apparatuses, inspection apparatuses, or medical apparatuses have a structure in which one of a light source section, provided with the light emitting module, and an object to be irradiated (referred to as an "irradiated object") is relatively moved, or driven to perform a scanning operation, in one direction with respect to the other to irradiate the irradiated object with light while a positional relationship between the light source section and the irradiated object is relatively varied. For such apparatuses, an increase in cumulative illuminance of light at a light irradiated surface of the irradiated object has been desired besides achievement of higher output of the light source section. The cumulative illuminance may be referred to as a "DOSE amount".

To address such demands, a shape of a structural member that has a lens function and serves to seal the light emitting element may be made appropriate, for example. However, it is revealed that even when the structural member has, for example, a lens shape so designed as to allow a light output of a single light emitting element to be high, the structural member does not necessarily make sufficiently high the cumulative illuminance at the light irradiated surface irradiated with the light derived from the light emitting module.

It is desirable to provide a light emitting module and a light irradiating apparatus that make it possible to improve light extraction efficiency per unit area.

A light emitting module according to an embodiment of the invention includes: a substrate; at least one light emitting element line including a plurality of light emitting elements that are arrayed on the substrate in a first direction; and at least one sealing lens sealing the at least one light emitting element line, and including a plurality of lens sections. The lens sections each include a spherical light emission surface having a convex shape, and are provided corresponding to the respective light emitting elements and continuous in the first direction. The lens sections each satisfy the following expressions (1) and (2):

$$0.5 Dp < R \le 0.75 Dp \qquad (1)$$

$$0.7 \le (2\pi R \times \theta / 360) \le 1.7 \qquad (2)$$

where Dp is a pitch width of the light emitting elements in the first direction, R is a curvature radius of the light emission surface of any of the lens sections, and θ is an angle [°], in a cross section perpendicular to the substrate taken along the first direction, of a virtual straight line to a central axis of a first light emitting element of the light emitting elements. The virtual straight line connects a contact point and a point. The contact point is a contact point where the light emission surface of a first lens section of the lens sections that corresponds to the first light emitting element is brought into contact with the light emission surface of a second lens section of the lens sections that corresponds to a second light emitting element adjacent to the first light emitting element. The point is located on the central axis of the first light emitting element at the light emission surface of the first light emitting element.

A light irradiating apparatus according to an embodiment of the invention includes: a light source section including a light emitting module; and a conveying section configured to vary a positional relationship between an irradiated object and the light source section. The irradiated object is irradiated with light derived from the light emitting module. The light emitting module includes: a substrate; at least one light emitting element line including a plurality of light emitting elements that are arrayed on the substrate in a first direction; and at least one sealing lens sealing the at least one light emitting element line, and including a plurality of lens sections. The lens sections each include a spherical light emission surface having a convex shape, and are provided corresponding to the respective light emitting elements and continuous in the first direction. The lens sections each satisfy the following expressions (1) and (2):

$$0.5Dp < R \leq 0.75Dp \quad (1)$$

$$0.7 \leq (2\pi R \times \theta/360) \leq 1.7 \quad (2)$$

where Dp is a pitch width of the light emitting elements in the first direction, R is a curvature radius of the light emission surface of any of the lens sections, and θ is an angle [°], in a cross section perpendicular to the substrate taken along the first direction, of a virtual straight line to a central axis of a first light emitting element of the light emitting elements. The virtual straight line connects a contact point and a point. The contact point is a contact point where the light emission surface of a first lens section of the lens sections that corresponds to the first light emitting element is brought into contact with the light emission surface of a second lens section of the lens sections that corresponds to a second light emitting element adjacent to the first light emitting element. The point is located on the central axis of the first light emitting element at the light emission surface of the first light emitting element.

According to the light emitting module and the light irradiating apparatus in the above-described embodiments of the invention, the lens sections in the at least one sealing lens are each so formed that the curvature radius R of any light emission surface falls within the above-described predetermined range set in relation to the pitch width Dp of the light emitting elements, and that an index (2πR×θ/360) representing a pseudo perimeter of any light emission surface falls within the above-described predetermined range. This makes it possible for the light emitting module to have the smallest possible pitch width of the light emitting elements, i.e., to have the highest possible packaging density of the light emitting elements per unit area, without significantly affecting a function of the lens sections. Hence, it is possible to improve extraction efficiency of light derived from each of the light emitting elements. It is therefore possible to achieve high cumulative illuminance in a light irradiated region, especially in an embodiment in which the light emitting module is moved or driven to perform a scanning operation in an array direction of the light emitting elements.

It is to be understood that both the foregoing general description and the following detailed description are exemplary, and are intended to provide further explanation of the invention as claimed. Also, effects of the invention are not limited to those described above. Effects achieved by the invention may be those that are different from the above-described effects, or may include other effects in addition to those described above.

BRIEF DESCRIPTION OF THE DRAWINGS

The accompanying drawings are included to provide a further understanding of the invention, and are incorporated in and constitute a part of this specification. The drawings illustrate some example embodiments and, together with the specification, serve to explain the principles of the invention.

DETAILED DESCRIPTION

Some example embodiments of the invention are described in detail below with reference to the accompanying drawings.

A light emitting module according to an example embodiment of the invention may be preferably used, without limitation, as a light source of a light irradiating apparatus in which one of a light source section and an object to be irradiated (referred to as an "irradiated object") is relatively moved, or driven to perform a scanning operation, in one direction with respect to the other to irradiate the irradiated object with light while a positional relationship between the light source section and the irradiated object is relatively varied. The light source section is provided with the light emitting module according to the example embodiment.

Figure 1:
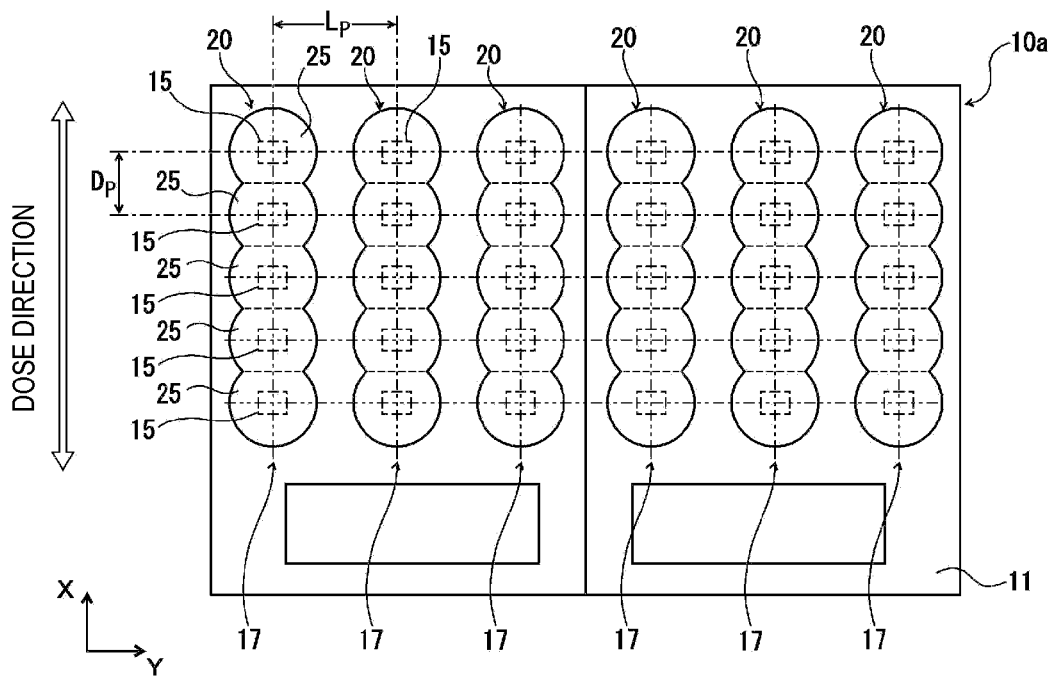
FIG. 1 is a plan view illustrating a schematic configuration of a light emitting module according to an example embodiment of the invention.
Figure 2:
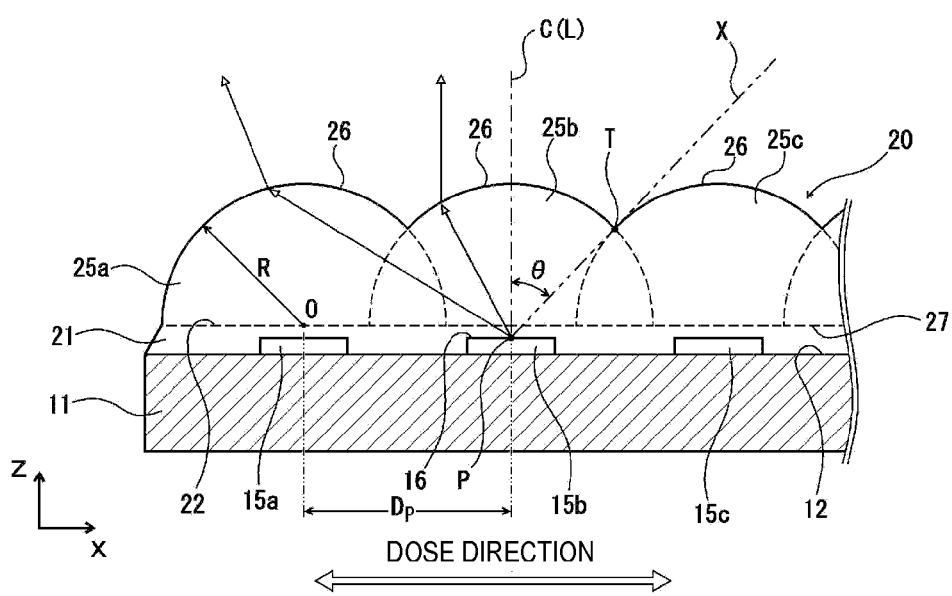
FIG. 2 is a cross-sectional view illustrating part of the light emitting module, taken along one direction, illustrated in FIG. 1.

FIG. 1 is a plan view illustrating a schematic configuration of the light emitting module (a light emitting module 10a) according to the example embodiment of the invention. FIG. 2 is a cross-sectional view illustrating part of the light emitting module, taken along one direction, illustrated in FIG. 1.

In the light emitting module 10a, a plurality of light emitting elements 15 are arrayed in matrix and mounted on one surface 12 of a substrate 11. The light emitting elements 15 each may be, for example but not limited to, an LED chip that may be rectangular in planar shape. The substrate 11 may be made of an insulating substrate.

More specifically, the light emitting elements 15 may be arranged on respective lattice points of a plane lattice virtually set on the one surface 12 of the substrate 11, for example. The plane lattice may be, for example but not limited to, a rectangular lattice. The light emitting elements 15 located at the respective lattice points on a lattice axis form a light emitting element line 17 that extends in the one direction described above. The lattice axis extends in an array direction of the light emitting elements 15 in which a center-to-center distance (a pitch width) from one light emitting element 15 to another adjacent light emitting element 15 is the minimum. Pieces of light derived from the respective light emitting elements 15 structuring the light emitting element line 17 are cumulated at a light irradiated surface, and the light irradiated surface is thus irradiated with the cumulated light.

In the following, for description purpose, the one direction described above, as a direction in which the pieces of light derived from the respective light emitting elements 15 structuring the light emitting element line 17 are emitted in a cumulative manner, is referred to in the example embodiment of the invention as an "X direction" or a "DOSE direction" (a vertical direction in FIG. 1). Also, a direction perpendicular to the DOSE direction in plan view is referred to as a "Y direction" (a horizontal direction in FIG. 1), and a direction perpendicular to the substrate 11 in plan view is referred to as a "Z direction" (a direction perpendicular to the drawing (page surface) in FIG. 1).

A sealing lens 20 is provided on the one surface 12 of the substrate 11 for each of the light emitting element lines 17. The sealing lens 20 is common to and seals each of the light emitting elements 15 structuring the single light emitting element line 17.

The sealing lenses 20 each include a base section 21 and a plurality of lens sections 25. The base section 21 is so provided as to cover a surrounding region of the light emitting element 15, such that the light emitting elements 15 structuring the corresponding light emitting element line 17 are embedded in the base sections 21. The lens sections 25 have respective bottom surfaces 27 that are continuous with respect to each other on one surface 22 of the base section 21, and correspond to the respective light emitting elements 15. The lens sections 25 each have a light emission surface 26 having a curved convex shape or a spherical shape. Each of the lens sections 25 is so formed that center of curvature O of a spherical surface structuring the light emission surface 26 is located on the one surface 22 of the base section 21, and that an optical axis L of the lens section 25 is brought into coincidence with a central axis C of a corresponding light emitting element 15. As used herein, the wording a "central axis C" is defined as an axis in the Z direction, extending from the light emitting center of a light emitting element 15 (hereinafter referred to as the "center point") in a direction toward a middle position (an highest position) of a light emitting surface 16 of the corresponding light emitting element 15.

The lens sections 25 each may be configured by a semi-spherical body or part of a spherical segment body whose spherical segment height is less than a curvature radius R, and those that are adjacent to one another in the X direction are provided in a continuous fashion with respect to one another. In this example embodiment, the lens sections 25 have the same shape as one another, i.e., the curvature radius R of the light emission surface 26 and the spherical segment height of the light emission surface 26 are the same in size as one another. The curvature radius R is shorter than a pitch width Dp of adjacent the light elements 15 in the X direction. Accordingly, the adjacent spherical light emission surfaces 26 meet at a contact arc having a highest contact point T (hereinafter referred to as the "contact point T." See FIG. 2). The contact point T is within an imaginary cross section plane perpendicular to the substrate taken along a light emitting element line 17 (FIG. 2) where the light emission surface 26 of a first lens section 25b of the lens sections that corresponds to the first light emitting element 15b is brought into contact with the light emission surface 26 of a second lens section 25c of the lens sections that corresponds to a second light emitting element 15c adjacent to the first light emitting element 15b, and the central point P is located on the central axis C of the first light emitting element 15c at the light emitting surface 16 of the first light emitting element 15c.

The insulating material structuring the substrate 11 may be, for example but not limited to, an aluminum nitride, alumina ceramics, a glass fiber reinforced epoxy resin, silicon ($SiO_2$), or other suitable material.

A material structuring the sealing lens 20 may be, for example but not limited to, a glass material, a transmissive resin material, or other suitable material. Examples of the glass material may include, without limitation, vitreous silica and borosilicate glass. Examples of the transmissive resin material may include, without limitation, a silicone resin, an acrylic resin, and an epoxy resin.

For example, the light emitting module 10a described above may have the following non-limiting configuration. The light emitting surface 16 of each of the light emitting elements 15 has horizontal and vertical sizes which may each be in a range from 0.3 mm to 1.4 mm without limitation. The pitch width (the center-to-center distance from one light emitting element 15 to another light emitting element 15 adjacent thereto in the X direction) Dp structuring the single light emitting element line 17 may be in a range from 0.4 mm to 5.0 mm without limitation. A separation distance from one light emitting element line 17 to another light emitting element line 17 (a center-to-center distance from one light emitting element 15 to another light emitting element 15 adjacent thereto in the Y direction in any mutually adjacent light emitting element lines 17 and 17) Lp may be in a range from 0.3 mm to 6.0 mm without limitation. An outer diameter of any lens section 25 (a size in the Y direction of the bottom surface 27 of any lens section 25) may be in a range from 0.9 mm to 11.0 mm without limitation.

In the light emitting module 10a as described above, the lens sections 25 in each of the sealing lenses 20 are each so formed that the curvature radius R of the light emission surface 26 satisfies the following expression.

$$0.5Dp < R \leq 0.75Dp$$

Also, referring to FIG. 2, the lens sections 25 in each of the sealing lenses 20 are each so formed that, in a cross section perpendicular to the substrate 11 taken along the X direction, an angle θ in degree)(° of a virtual straight line X to the central axis C of a first light emitting element 15b satisfies the following expression.

$$0.7 \leq (2\pi R \times \theta/360) \leq 1.7$$

In a cross section perpendicular to the substrate 11 taken along the X direction, the virtual straight line X connects a contact point T and a center point P. The contact point T is where the light emission surface 26 of a lens section 25b corresponding to the first light emitting element 15b and the light emission surface 26 of a lens section 25c corresponding to a second light emitting element 15c adjacent to the first light emitting element 15b are brought into contact with each other. The center point P is located on the central axis C of the first light emitting element 15b at a center of the light emitting surface 16 of the first light emitting element 15b. Also, "R" denotes the curvature radius [mm] set to fall within the predetermined range described above, and ($2\pi R \times \theta/360$) is an index that represents a pseudo perimeter of the light emission surface 26 of any lens section 25.

In the following description, any light emitting element is designated with a reference numeral "15" and any lens section is designated with a reference numeral "25" unless otherwise designated to refer to specific light emitting element or lens section.

Also, in the light emitting elements belonging to the same light emitting element line 17 as the first light emitting element 15b and adjacent to the first light emitting element 15b, e.g., the light emitting elements 15a and 15c, the lens sections 25a and 25c corresponding respectively to the light emitting elements 15a and 15c are each so formed as to have the shape in which the curvature radius R of the light emission surface 26 falls within the above-described predetermined range set in relation to the pitch width Dp of the light emitting elements 15, and in which the pseudo perimeter of the light emission surface 26 falls within the above-described predetermined range.

As illustrated in FIG. 2, in the light emitting module 10a, light emitted from the first light emitting element 15b is refracted by the light emission surface 26 of the lens section 25b corresponding to that first light emitting element 15b, or by the light emission surface 26 of the lens section 25a corresponding to the second light emitting element 15a adjacent to that first light emitting element 15b, before exiting the light emission surface 26.

In the light emitting module 10a having the configuration described above, basically, the pieces of light emitted through the sealing lens 20 from the respective light emitting elements 15 structuring the light emitting element lines 17 are superimposed with respect to one another to compensate one another in a light irradiated region, making it possible to achieve highly-uniform illuminance distribution in the X direction. Also, the lens sections 25 in each of the sealing lenses 20 are each so formed that the curvature radius R of the light emission surface 26 falls within the predetermined range described above, and that the pseudo perimeter of the light emission surface 26 falls within the above-described predetermined range. This makes it possible for the light emitting module 10a to have the smallest possible pitch width Dp of the light emitting elements 15 in the light emitting element lines 17, i.e., to have the highest possible packaging density of the light emitting elements 15 per unit area, without significantly affecting a function of the lens sections 25. Hence, it is possible to improve extraction efficiency of light derived from each of the light emitting elements 15. It is therefore possible to achieve high cumulative illuminance (a DOSE amount) in a light irradiated region, especially in an example embodiment in which the light emitting module 10a is moved or driven to perform a scanning operation in the X direction as shown by results of respective Experimental Examples to be described later.

As described above, the light emitting module according to an example embodiment may be preferably used, without limitation, as the light source of the light irradiating apparatus in which one of the light source section, provided with the light emitting module, and the irradiated object is relatively moved, or driven to perform a scanning operation, with respect to the other to irradiate the irradiated object with light while a positional relationship between the light source section and the irradiated object is relatively varied. In the following, a description is given of one specific but non-limiting application example of the light emitting module according to the example embodiment of the invention.

Figure 3:
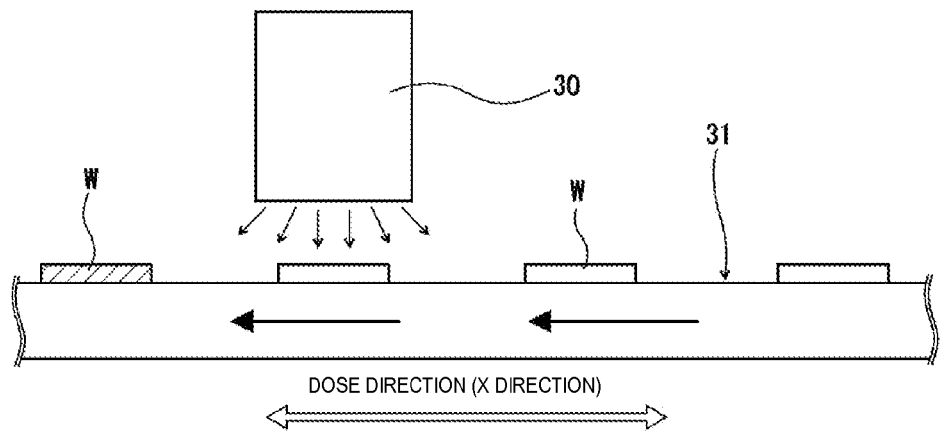
FIG. 3 illustrates a schematic configuration of a light treatment apparatus as a light irradiating apparatus according to an example embodiment of the invention, in which the light irradiating apparatus includes the light emitting module according to one example embodiment as a light source.

FIG. 3 illustrates a schematic configuration of a light treatment apparatus as a light irradiating apparatus according to an example embodiment of the invention. The light irradiating apparatus includes the light emitting module according to the example embodiment as a light source.

The light treatment apparatus includes a light source section 30 and a conveying mechanism 31. The light source section 30 may be fixed to an unillustrated frame such as a machine frame. The conveying mechanism 31 so conveys an irradiated object W in one direction as to allow the irradiated object W to travel through a region (a light irradiated region) irradiated with light derived from the light source section 30. In the light source section 30, the light emitting module 10a described above is so provided as to allow the array direction (the X direction) of the light emitting elements 15 structuring the light emitting element lines 17 to be brought into coincidence with a direction in which the irradiated object W is moved (denoted by arrows filled in black in the drawing).

Figure 4:
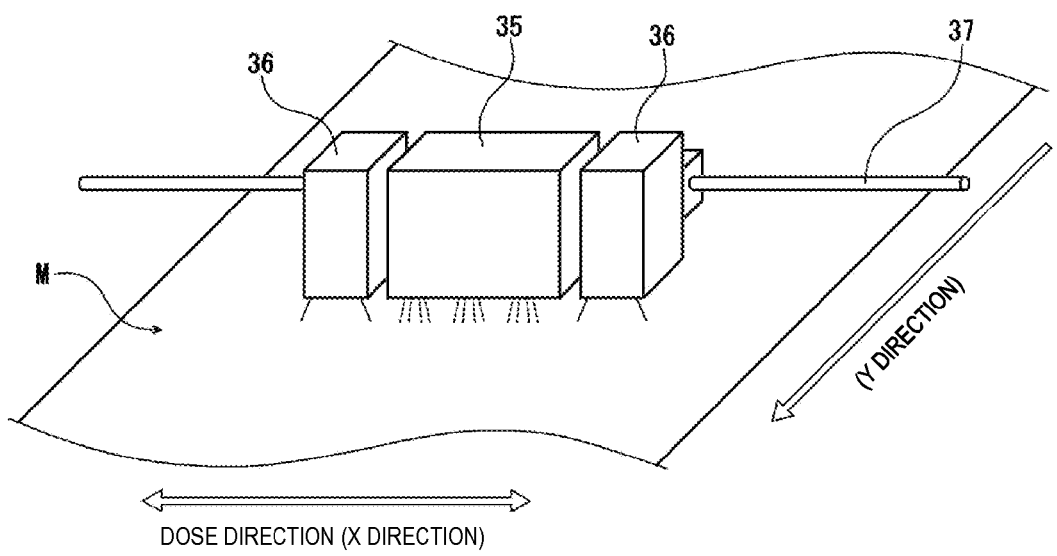
FIG. 4 is a perspective view illustrating a schematic configuration of an ink-jet printer as the light irradiating apparatus that includes the light emitting module according to one example embodiment as the light source.

FIG. 4 is a perspective view illustrating a schematic configuration of an ink-jet printer as the light irradiating apparatus that includes the light emitting module according to the example embodiment as the light source.

The ink-jet printer includes an ink-jet head 35 and light source sections 36. The ink-jet head 35 ejects an ink onto a printing medium M conveyed by any conveying device. The printing medium M may be, for example but not limited to, paper. The light source sections 36 may be provided on both sides of the ink-jet head 35. The ink-jet head 35 and the light source sections 36 may be suspended by a guiderail 37 to be located above the printing medium M with a predetermined interval provided in between, and are driven to perform a scanning operation in a direction (main scanning direction, or in the X direction) perpendicular to the conveying direction of the printing medium M (sub-scanning direction, or the Y direction) in plan view. In each of the light source sections 36, the light emitting module 10a described above is so provided as to allow the array direction (the X direction) of the light emitting elements 15 structuring the light emitting element lines 17 to be brought into coincidence with the main scanning direction. In this example embodiment, the light emitting module 10a may include, as the light emitting elements 15, LED chips having an emission wavelength in an ultraviolet range, for example.

In each light irradiating apparatus described above, the light emitting module 10a used as the light source makes it possible to achieve high cumulative illuminance in the light irradiated region formed on the irradiated object. Hence, it is possible to perform a desired light irradiation treatment efficiently.

Although the invention has been described in the foregoing by way of example with reference to the example embodiments, the invention is not limited thereto but may be modified in a wide variety of ways.

For example, a pattern of the arrangement of the light emitting elements is not limited to the arrangement pattern described in the example embodiment described above, as long as the lens sections in each of the sealing lenses are each so formed as to have the predetermined shape in which the curvature radius of the light emission surface falls within the above-described predetermined range set in relation to the pitch width of the light emitting elements, and in which the pseudo perimeter of the light emission surface falls within the above-described predetermined range.

Figure 5:
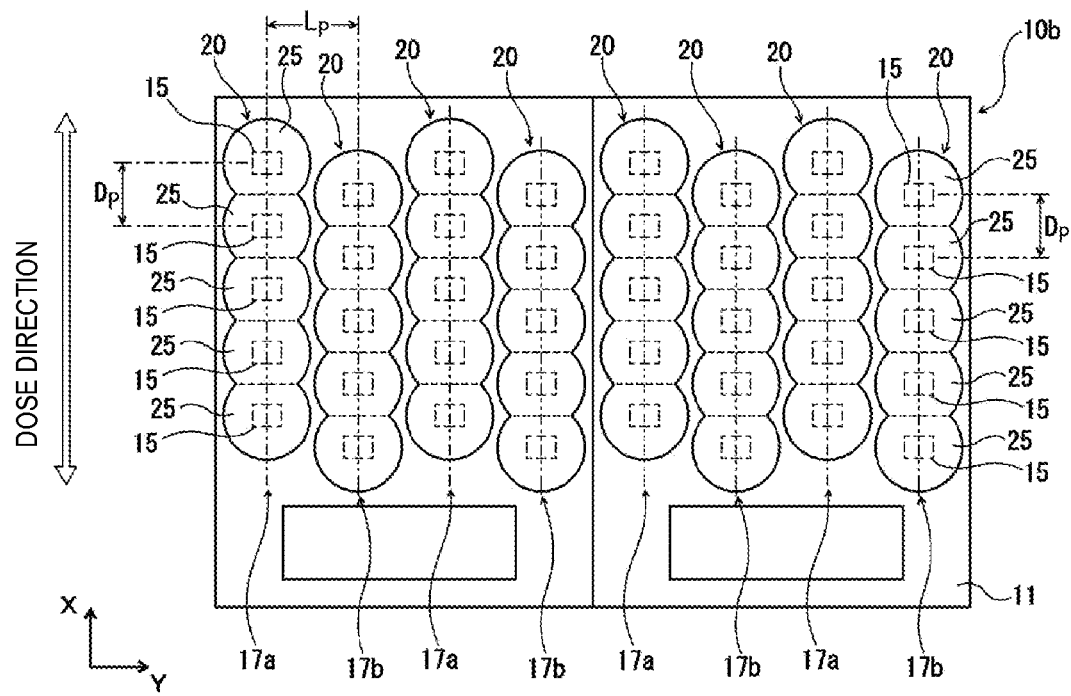
FIG. 5 is a plan view illustrating a schematic configuration of the light emitting module according to another example embodiment of the invention.

FIG. 5 is a plan view illustrating a schematic configuration of the light emitting module (a light emitting module 10b) according to another example embodiment of the invention. In the light emitting module 10b according to this example embodiment, the light emitting elements 15 are disposed in a staggered fashion (in a shape of orthorhombic lattice). More specifically, one light emitting element line 17a is so disposed with respect to another adjacent light emitting element line 17b as to be displaced in the array direction (the X direction) of the light emitting elements 15 structuring the light emitting element lines 17. In the following description, any light emitting element line is designated with a reference numeral "17" unless otherwise designated to refer to specific light emitting element line. In this example embodiment, the pitch widths Dp of the light emitting elements 15 in each of the light emitting element lines 17 may be the same in size. Also, the separation distance from one light emitting element line 17a to another light emitting element line 17b (the center-to-center distance from one light emitting element 15 to another light emitting element 15 adjacent thereto in the Y direction in any mutually adjacent light emitting element lines 17a and 17b) Lp may be the same in size.

The sealing lens 20 is provided on the one surface 12 of the substrate 11 for each of the light emitting element lines 17. The sealing lens 20 is common to and seals each of the light emitting elements 15 structuring the single light emitting element line 17.

The light emitting module 10b having the configuration described above makes it possible to increase the packaging density of the light emitting elements 15 per unit area. Hence, it is possible to ensure that the example effects described above are achieved.

Figure 6:
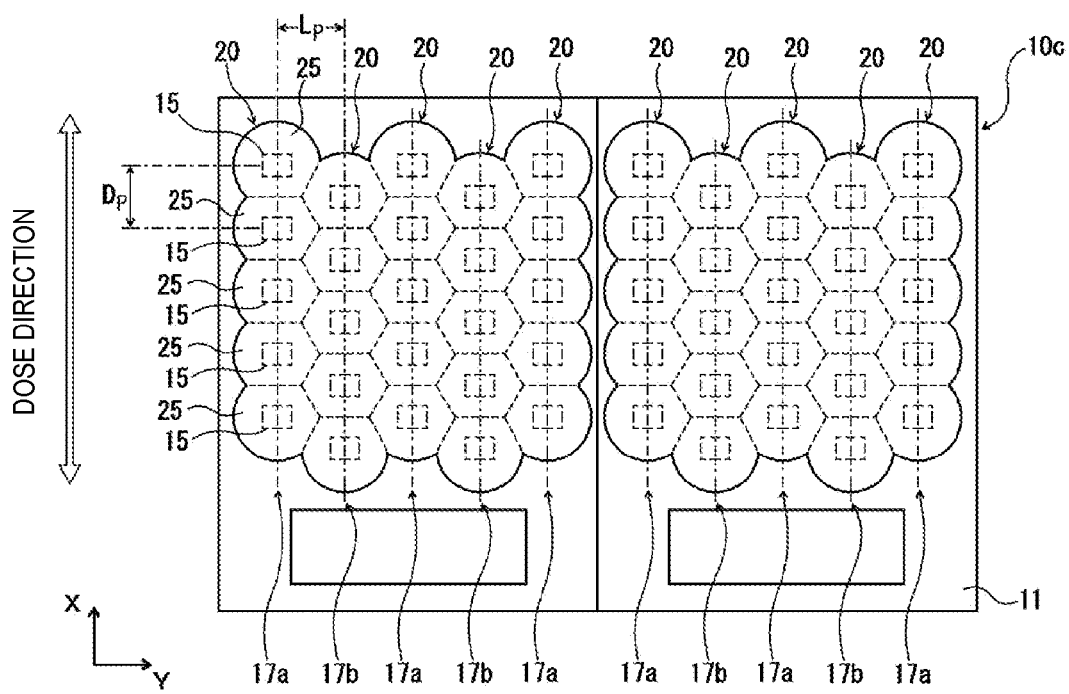
FIG. 6 is a plan view illustrating a schematic configuration of the light emitting module according to still another example embodiment of the invention.

In another example embodiment, a light emitting module 10c may further have a configuration in which the sealing lenses 20 of the respective light emitting element lines 17 are formed in a continuous fashion with respect to each other in the Y direction as well, as illustrated in FIG. 6.

The light emitting module 10c having the configuration described above makes it possible to further increase the packaging density of the light emitting elements 15 per unit area. Hence, it is possible to further ensure that the example effects described above are achieved.

In addition, for example, a configuration may be employed in the light emitting module 10a illustrated in FIG. 1 in which the lens sections 25 have different shapes from one another, as long as the lens sections 25 in each of the sealing lenses 20 of the respective light emitting element lines 17 are each so formed that the curvature radius R of the light emission surface 26 falls within the predetermined range described above, and that the pseudo perimeter of the light emission surface 26 falls within the above-described predetermined range. Also, a configuration may be employed in which the sealing lenses 20 of the respective light emitting element lines 17 are formed in respective shapes (or sizes) different from one another, as illustrated in FIG. 7.

Figure 7:
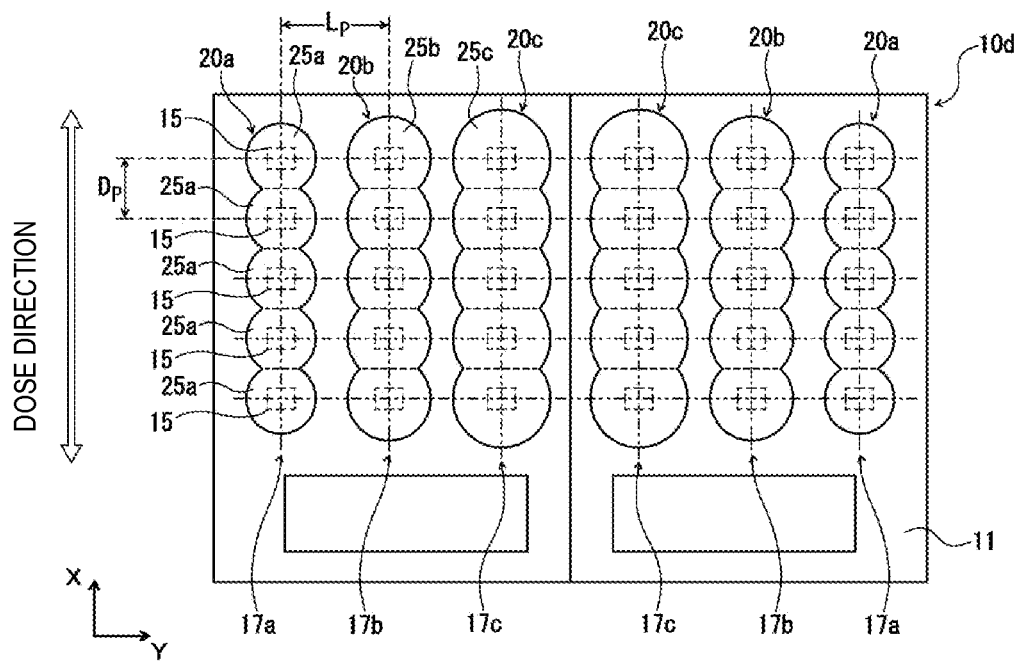
FIG. 7 is a plan view illustrating a schematic configuration of the light emitting module according to still another example embodiment of the invention.

A light emitting module 10d illustrated in FIG. 7 according to still another example embodiment has a configuration in which the sealing lenses 20 are so formed that the lens sections 25 are each larger in outer diameter as approaching the sealing lens 20 of the light emitting element line 17 located in the middle of the substrate 11 in the Y direction (in a direction in which the light emitting element lines 17 are arranged).

The light emitting module 10d according to this example embodiment makes it possible to make an amount of irradiation light in the light irradiated region as a whole to be uniform, i.e., to increase uniformity of the irradiation light amount in the light irradiated region, for one reason discussed below.

The light emitting module 10a having the configuration illustrated in FIG. 1 (the configuration in which the lens sections 25 are the same in outer diameter) results in an illuminance distribution in which illuminance (a light amount) in a middle region in the Y direction of the light irradiated region is higher than illuminance (a light amount) in each end region in the Y direction of the light irradiated region. On the other hand, the cumulative illuminance (the DOSE amount) becomes low with an increase in the curvature radius R of the lens section 25 as shown by results of Experimental Examples described later. Hence, making the outer diameter of each of the lens sections 25b in the sealing lens 20b belonging to the light emitting element line 17b located adjacent to the light emitting element line 17a larger than the outer diameter of each of the lens sections 25a in the sealing lens 20a belonging to the light emitting element line 17a that is located at each end of the substrate 11 in the Y direction, and making the outer diameter of each of the lens sections 25c in the sealing lens 20c belonging to the light emitting element line 17c located adjacent to the light emitting element line 17b even larger than the outer diameter of each of the lens sections 25b in the sealing lens 20b belonging to the light emitting element line 17b allow the light amount derived from a middle part of the substrate 11 in the Y direction to be kept small to the same level as the light amount derived from the ends of the substrate 11 in the Y direction. This therefore makes it possible to make the amount of irradiation light in the light irradiated region as a whole to be uniform, i.e., to increase the uniformity of the irradiation light amount as described above.

Figure 8:
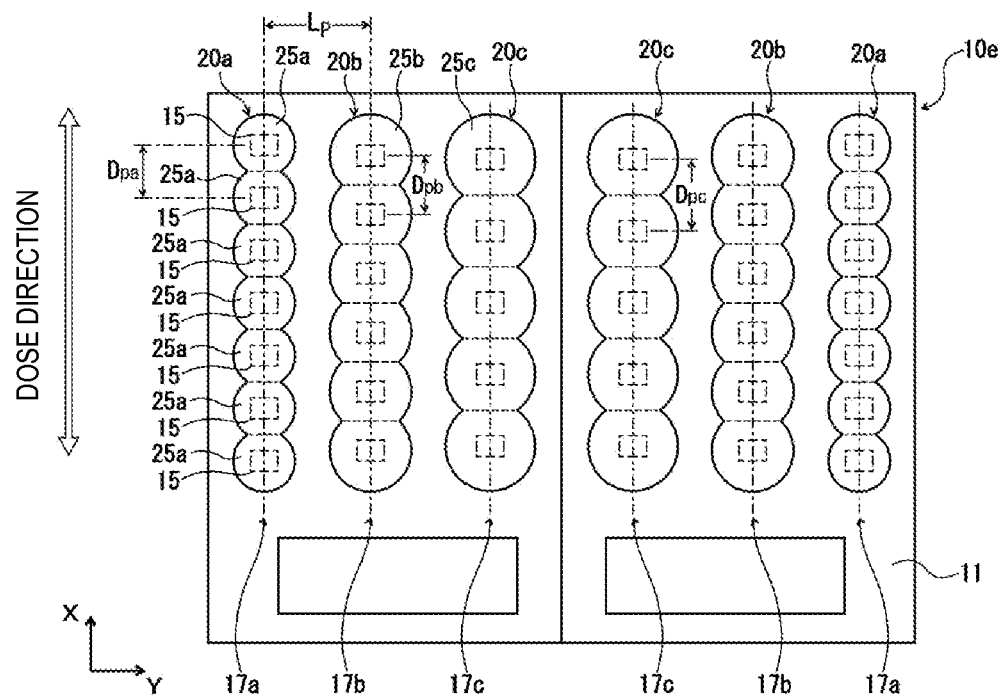
FIG. 8 is a plan view illustrating a schematic configuration of the light emitting module according to still another example embodiment of the invention.

Also, a light emitting module having the configuration described above may further be so configured that the number of light emitting elements 15 structuring the light emitting element line 17 differs for each of the light emitting element lines 17 as illustrated in FIG. 8 according to still another example embodiment. In a light emitting module 10e according to this example embodiment, the light emitting elements 15 are so arranged that the number of light emitting elements 15 structuring the light emitting element line 17 decreases (i.e., the packaging density becomes low), as approaching the light emitting element line 17 located in the middle of the substrate 11 in the Y direction (in the direction in which the light emitting element lines 17 are arranged). In other words, the light emitting elements 15 are so arranged that a pitch width Dpb of the light emitting elements 15 belonging to the light emitting element line 17b located adjacent to the light emitting element line 17a is larger than a pitch width Dpa of the light emitting elements 15 belonging to the light emitting element line 17a that is located at each end of the substrate 11 in the Y direction, and that a pitch width Dpc of the light emitting elements 15 belonging to the light emitting element line 17c located adjacent to the light emitting element line 17b is even larger than the pitch width Dpb of the light emitting elements 15 belonging to the light emitting element line 17b. For example, the separation distance from one light emitting element line 17 to another light emitting element line 17 (the center-to-center distance from one light emitting element 15 to another light emitting element 15 adjacent thereto in the Y direction in any mutually adjacent light emitting element lines 17 and 17) Lp may be the same in size.

Also, in the light emitting module 10e according to this example embodiment, the sealing lenses 20 are so formed that the lens sections 25 are each larger in outer diameter as approaching the sealing lens 20 of the light emitting element line 17 located in the middle of the substrate 11 in the Y direction (in the direction in which the light emitting element lines 17 are arranged). In other words, the sealing lenses 20 are so formed that the outer diameter of each of the lens sections 25b in the sealing lens 20b belonging to the light emitting element line 17b located adjacent to the light emitting element line 17a is larger than the outer diameter of each of the lens sections 25a in the sealing lens 20a belonging to the light emitting element line 17a that is located at each end of the substrate 11 in the Y direction, and that the outer diameter of each of the lens sections 25c in the sealing lens 20c belonging to the light emitting element line 17c located adjacent to the light emitting element line 17b is even larger than the outer diameter of each of the lens sections 25b in the sealing lens 20b belonging to the light emitting element line 17b.

Employing the configuration described above makes it possible to further increase the uniformity of the irradiation light amount in the light irradiated region.

In each of the light emitting modules according to the example embodiments of the invention, the number of light emitting elements mounted on the substrate, the number of sealing lenses, or the number of other elements, are not particularly limited to the number described above.

In each of the light emitting modules according to the example embodiments of the invention, a configuration may be employed in which the base sections of the respective sealing lenses belonging to the mutually-adjacent light emitting element lines may be provided in a continuous fashion, i.e., the base section may be shared by the sealing lenses.

Furthermore, the invention encompasses any possible combination of some or all of the various embodiments described herein and incorporated herein.

EXAMPLES

In the following, some Experimental Examples of the invention are described. It should be understood that these Experimental Examples are illustrative, and should not be construed as being limiting in any way.

Experimental Example 1

A plurality of types of light emitting modules according to the invention, which were different in shape of the lens section from one another, were fabricated in accordance with the configuration illustrated in FIGS. 1 and 2. The light emitting modules, which are referred to as "light emitting modules (Group A)" hereinafter, had the following specifications.
Light Emitting Elements (15)
  LED chips, each had a dimension of 1 mm (in X direction)×1 mm (in Y direction)×0.1 mm (in Z direction)
  Output of each LED chip: 0.5 W
  Emission wavelength (peak wavelength) of each LED chip: 395 nm
  The number of LEDs: 40, i.e., 8 in DOSE direction (in X direction) and 5 in direction perpendicular to the DOSE direction (in Y direction)
  Pitch width (Dp) in DOSE direction (in X direction): 2 mm
  Pitch width (Dp) in direction perpendicular to the DOSE direction (in Y direction): 4 mm
Sealing Lens (20)
  Material: silicone resin
  Thickness of base section (21)—0.4 mm
  Shape of each lens section (25): spherical segment body
  Curvature Radius R of emission surface of each lens section: 1.1 mm (R=0.55 Dp)
  Spherical segment height of spherical segment body of each lens section: size allowing θ in FIG. 2 to fall in range from 26.04° to 104.17°

Experimental Example 2

A plurality of types of light emitting modules that were different in shape of the lens section from one another were fabricated (referred to as "light emitting modules (Group B)" hereinafter). The light emitting modules (Group B) each had the same configuration as the light emitting modules (Group A) according to the Experimental Example 1, with the exception that the curvature radius (spherical segment height) R of the emission surface of each lens section was 1.245 mm (R≈0.62 Dp) unlike the light emitting modules (Group A) fabricated in the Experimental Example 1.

In the light emitting modules (Group B), an appropriate modification was made to the spherical segment height of the spherical segment body of each of the lens sections to allow θ in FIG. 2 to fall in a range from 23.01° to 88.68°.

Experimental Example 3

A plurality of types of light emitting modules that were different in shape of the lens section from one another were fabricated (referred to as "light emitting modules (Group C)" hereinafter). The light emitting modules (Group C) each had the same configuration as the light emitting modules (Group A) according to the Experimental Example 1, with the exception that the curvature radius (spherical segment height) R of the emission surface of each lens section was 1.5 mm (R=0.75 Dp) unlike the light emitting modules (Group A) fabricated in the Experimental Example 1.

In the light emitting modules (Group C), an appropriate modification was made to the spherical segment height of the spherical segment body of each of the lens sections to allow θ in FIG. 2 to fall in a range from 19.10° to 76.39°.

Experimental Example 4

A plurality of types of light emitting modules that were different in shape of the lens section from one another were fabricated (referred to as "light emitting modules (Group D)" hereinafter). The light emitting modules (Group D) each had the same configuration as the light emitting modules (Group A) according to the Experimental Example 1, with the exception that the curvature radius (spherical segment height) R of the emission surface of each lens section was 1.6 mm (R=0.8 Dp) unlike the light emitting modules (Group A) fabricated in the Experimental Example 1.

In the light emitting modules (Group D), an appropriate modification was made to the spherical segment height of the spherical segment body of each of the lens sections to allow θ in FIG. 2 to fall in a range from 42.97° to 53.71°.

Figure 9:
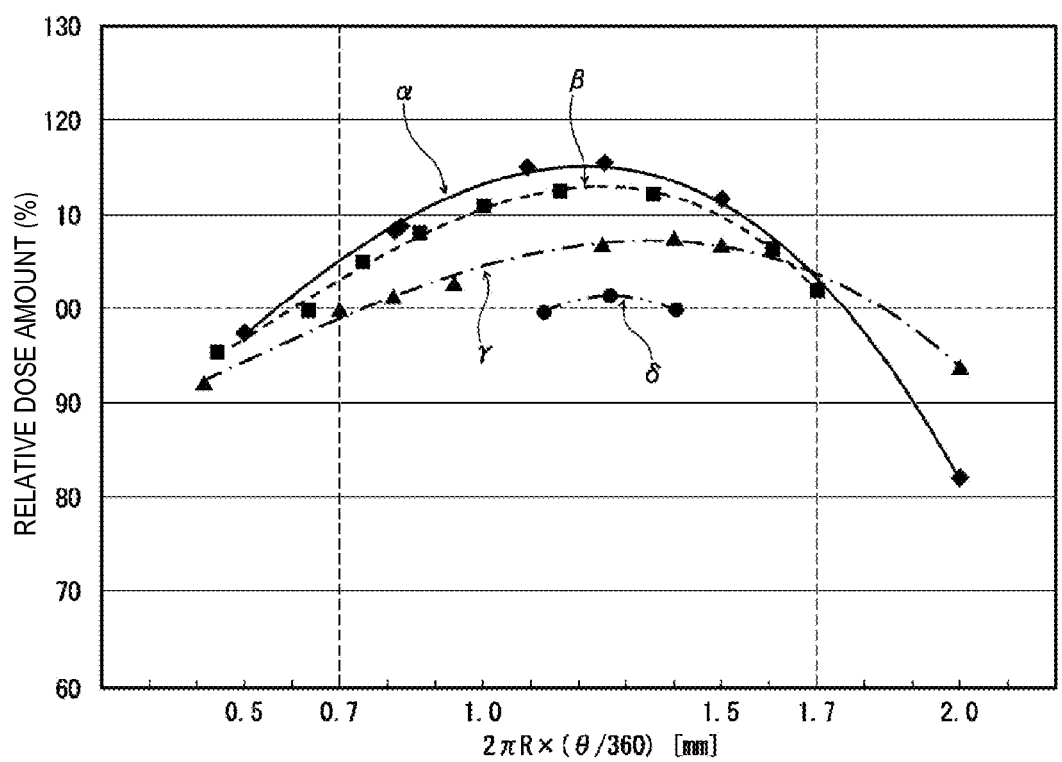
FIG. 9 is a graph showing cumulative illuminance of each of light emitting modules fabricated in respective Experimental Examples 1 to 4.
Figure 10:
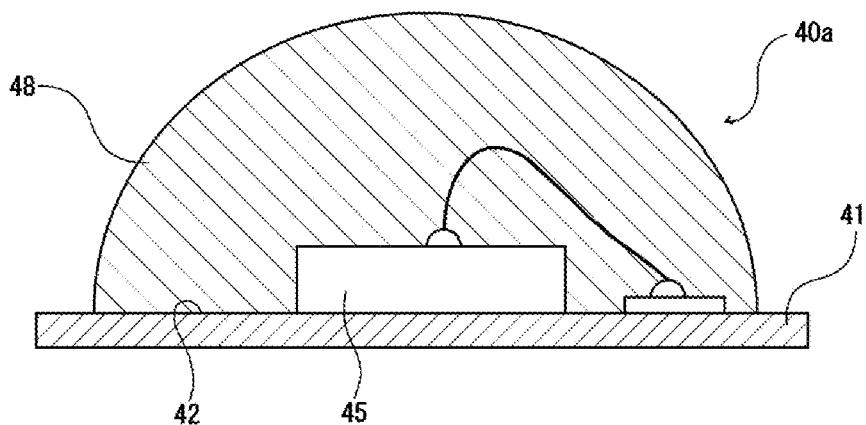
FIG. 10 is a cross-sectional view illustrating a schematic configuration of a light emitting module according to one example of a related art.
Figure 11:
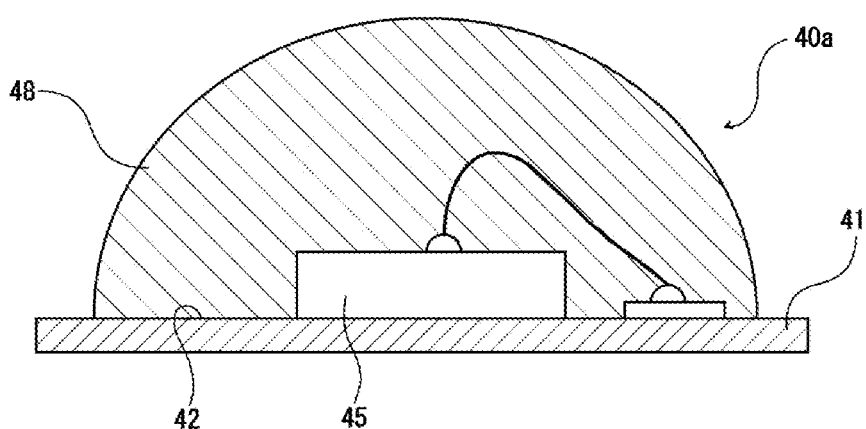
FIG. 11 is a cross-sectional view illustrating a schematic configuration of a conventional light emitting module according to another example of a related art.

Measurement of the cumulative illuminance (the DOSE amount) at the light irradiated surface was performed as follows on each of the thus-fabricated light emitting modules (Group A) to light emitting modules (Group D). FIG. 9 shows results of the measurement. In FIG. 9, a horizontal axis represents a pseudo perimeter (($2\pi R \times \theta/360$) [mm]) of any lens section in each of the light emitting modules, and a vertical axis represents a relative value (a relative DOSE amount) of the cumulative illuminance of each of the light emitting modules where the cumulative illuminance (the DOSE amount) derived from a light emitting module having no sealing lens is defined as 100%. Also, in FIG. 9, a curve α denoted by a solid line (plots denoted by rhombuses) represents a result of the light emitting modules (Group A), a curve β denoted by a broken line (plots denoted by squares) represents a result of the light emitting modules (Group B), a curve γ denoted by a dashed dotted line (plots denoted by triangles) represents a result of the light emitting modules (Group C), and a curve δ denoted by a dashed two dotted line (plots denoted by circles) represents a result of the light emitting modules (Group D).

To obtain the cumulative illuminance (the DOSE amount), a process was performed on a plurality of measurement locations in the X direction (the array direction of the light emitting elements structuring the light emitting element lines). The process obtained an integration value of an illuminance distribution through measurement in which an illuminance meter was moved above the light irradiated surface in the Y direction (the array direction of the light emitting element lines) at a velocity of 50 m/min. The light irradiated surface was away from the light emitting module by 5 mm. An average value of all of the integration values thus obtained for the plurality of measurement locations was calculated to obtain the cumulative illuminance (the DOSE amount).

Results of the Experimental Examples confirmed that the cumulative illuminance (the relative DOSE amount) at the light irradiated surface becomes lower when the curvature radius of the light emission surface of any lens section is made larger. It was also confirmed that forming any lens section to satisfy the predetermined range (0.5 Dp<R≤0.75 Dp) for the curvature radius R [mm] of the emission surface of any lens section and satisfy the predetermined range from 0.7 to 1.7 for the pseudo perimeter (2πR×(θ/360) [mm]) of the light emission surface of any lens section makes it possible to achieve high cumulative illuminance.

Although the invention has been described in terms of exemplary embodiments, it is not limited thereto. It should be appreciated that variations may be made in the described embodiments by persons skilled in the art without departing from the scope of the invention as defined by the following claims. The limitations in the claims are to be interpreted broadly based on the language employed in the claims and not limited to examples described in this specification or during the prosecution of the application, and the examples are to be construed as non-exclusive. For example, in this disclosure, the term "preferably", "preferred" or the like is non-exclusive and means "preferably", but not limited to. The use of the terms first, second, etc. do not denote any order or importance, but rather the terms first, second, etc. are used to distinguish one element from another. The term "substantially" and its variations are defined as being largely but not necessarily wholly what is specified as understood by one of ordinary skill in the art. The term "about" or "approximately" as used herein can allow for a degree of variability in a value or range. Moreover, no element or component in this disclosure is intended to be dedicated to the public regardless of whether the element or component is explicitly recited in the following claims.

What is claimed is:

1. A light emitting module, comprising:
a substrate;
at least one light emitting element line including a plurality of light emitting elements that are arrayed on the substrate in a first direction; and
at least one sealing lens sealing the at least one light emitting element line, and including a plurality of lens sections, the lens sections each including a spherical light emission surface having a convex shape, and being provided corresponding to the respective light emitting elements and continuous in the first direction, the lens sections include a first lens section and a second lens section that correspond to a first light emitting element and a second light emitting element adjacent to the first light emitting element respectively, the second lens section is adjacent to the first lens section, the lens sections each satisfy the following expressions (1) and (2):

$$0.5 Dp < R \leq 0.75 Dp \quad (1)$$

$$0.7 \leq (2\pi R \times \theta/360) \leq 1.7 \quad (2)$$

wherein Dp is a pitch width of the light emitting elements in the first direction, R is a curvature radius of the light emission surface of any of the lens sections, and θ is an angle in degree (°), in a cross section perpendicular to the substrate taken along the first direction, of a virtual straight line to a central axis of the first light emitting element, the virtual straight line connecting a contact point and a central point, the contact point is located where a first light emission surface of the first lens section is brought into contact with a second light emission surface of the second lens section, and the central point being located on the central axis of the first light emitting element at a center of a light emission surface of the first light emitting element, the central axis is perpendicular to the first direction.

2. The light emitting module according to claim 1, wherein
the light emitting module comprises a plurality of light emitting element lines, and
the plurality of light emitting element lines are arrayed in a second direction orthogonal to the first direction.

3. The light emitting module according to claim 2, wherein the light emitting elements are arranged on respective lattice points of an orthorhombic lattice on the substrate.

4. The light emitting module according to claim 3, wherein
the at least one sealing lens comprises a plurality of sealing lenses, and
the plurality of sealing lenses are arrayed in the second direction, and are continuous with respect to each other.

5. The light emitting module according to claim 2, wherein
the at least one sealing lens comprises a plurality of sealing lenses, and
a first sealing lens of the plurality of sealing lenses that seals a first light emitting element line of the plurality of light emitting element lines has a size different from a size of a second sealing lens of the plurality of sealing lenses that seals a second light emitting element line of the plurality of light emitting element lines that is adjacent to the first light emitting element line.

6. The light emitting module according to claim 5, wherein
the sealing lenses seal the respective light emitting element lines, and
a size of any of the sealing lenses that is located in a middle region of the sealing lenses in the second direction is larger than a size of any of the sealing lenses that is located at an end of the sealing lenses in the second direction.

7. The light emitting module according to claim 6, wherein the number of the light emitting elements in any of the light emitting element lines that is located in a middle region of the light emitting element lines in the second direction is larger than the number of the light emitting elements in any of the light emitting element lines that is located at an end of the light emitting element lines in the second direction.

8. A light irradiating apparatus, comprising:
a light source section including a light emitting module; and a conveying section configured to vary a positional relationship between an irradiated object and the light source section, the irradiated object being irradiated with light derived from the light emitting module, the light emitting module comprising:

a substrate;

at least one light emitting element line including a plurality of light emitting elements that are arrayed on the substrate in a first direction; and at least one sealing lens sealing the at least one light emitting element line, and including a plurality of lens sections, the lens sections each including a spherical light emission surface having a convex shape, and being provided corresponding to the respective light emitting elements and continuous in the first direction, the lens sections include a first lens section and a second lens section that correspond to a first light emitting element and a second light emitting element adjacent to the first light emitting element respectively, the second lens section is adjacent to the first lens section, the lens sections each satisfy the following expressions (1) and (2):

$$0.5Dp < R \leq 0.75Dp \quad (1)$$

$$0.7 \leq (2\pi R \times \theta/360) \leq 1.7 \quad (2)$$

wherein Dp is a pitch width of the light emitting elements in the first direction, R is a curvature radius of the light emission surface of any of the lens sections, and $\theta$ is an angle in degree (°), in a cross section perpendicular to the substrate taken along the first direction, of a virtual straight line to a central axis of the first light emitting element, the virtual straight line connecting a contact point and a central point, the contact point is located where a first light emission surface of the first lens section is brought into contact with a second light emission surface of the second lens section, and the central point being located on the central axis of the first light emitting element at a center of a light emission surface of the first light emitting element, the central axis is perpendicular to the first direction.

9. A light irradiating apparatus, comprising:

a light source section including the light emitting module according to claim 1; and a conveying section configured to vary a positional relationship between an irradiated object and the light source section, the irradiated object being irradiated with light derived from the light emitting module.

10. A light emitting module, comprising:

a substrate;

at least one light emitting element line including a first light emitting element and a second light emitting element adjacent to the first light emitting element, the first and second emitting elements are arrayed on the substrate in a first direction; and at least one sealing lens that seals the at least one light emitting element line, the at least one sealing lens comprises first and second lens sections, the first and second lens sections include spherical first and second light emission surfaces respectively each having a convex shape, being provided corresponding to the respective first and second light emitting elements and being continuous in a first direction, the lens sections each satisfy the following expressions (1) and (2):

$$0.5Dp < R \leq 0.75Dp \quad (1)$$

$$0.7 \leq (2\pi R \times \theta/360) \leq 1.7 \quad (2)$$

wherein Dp is a pitch width of the first and second light emitting elements in the first direction, R is a curvature radius of the light emission surfaces of the first and second lens sections, and $\theta$ is an angle, in degree, of a virtual straight line to a central axis in a cross section perpendicular to the substrate taken along the at least one light emitting element line, wherein the central axis is perpendicular to a light emitting surface of the first light emitting element at a center point of the light emitting surface, the virtual straight line is connecting the center point to a contact point where the first light emission surface is brought into contact with the second light emission surface in the cross section.

11. The light emitting module according to claim 1, wherein the light emitting module comprises a plurality of light emitting element lines, and the plurality of light emitting element lines are arrayed in a second direction orthogonal to the first direction.

12. The light emitting module according to claim 11, wherein the light emitting elements are arranged on respective lattice points of an orthorhombic lattice on the substrate.

13. The light emitting module according to claim 12, wherein the at least one sealing lens comprises a plurality of sealing lenses, and the plurality of sealing lenses are arrayed in the second direction, and are continuous with respect to each other.

14. The light emitting module according to claim 11, wherein the at least one sealing lens comprises a plurality of sealing lenses, and a first sealing lens of the plurality of sealing lenses that seals a first light emitting element line of the plurality of light emitting element lines has a size different from a size of a second sealing lens of the plurality of sealing lenses that seals a second light emitting element line of the plurality of light emitting element lines that is adjacent to the first light emitting element line.

15. The light emitting module according to claim 14, wherein the sealing lenses seal the respective light emitting element lines, and a size of any of the sealing lenses that is located in a middle region of the sealing lenses in the second direction is larger than a size of any of the sealing lenses that is located at an end of the sealing lenses in the second direction.

16. The light emitting module according to claim 15, wherein the number of the light emitting elements in any of the light emitting element lines that is located in a middle region of the light emitting element lines in the second direction is larger than the number of the light emitting elements in any of the light emitting element lines that is located at an end of the light emitting element lines in the second direction.

* * * * *